(12) United States Patent
Tailliet

(10) Patent No.: US 11,811,221 B2
(45) Date of Patent: Nov. 7, 2023

(54) ELECTROSTATIC DISCHARGE PROTECTION DEVICE

(71) Applicant: STMicroelectronics (Rousset) SAS, Rousset (FR)

(72) Inventor: François Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 28 days.

(21) Appl. No.: 17/643,530

(22) Filed: Dec. 9, 2021

(65) Prior Publication Data
US 2022/0247169 A1 Aug. 4, 2022

(30) Foreign Application Priority Data

Jan. 29, 2021 (FR) ...................................... 2100868

(51) Int. Cl.
*H02H 9/04* (2006.01)
(52) U.S. Cl.
CPC ..................... *H02H 9/04* (2013.01)
(58) Field of Classification Search
CPC ....... H02H 9/04; H02H 9/046; H01L 27/0251
USPC .......................................................... 361/56
See application file for complete search history.

(56) References Cited

U.S. PATENT DOCUMENTS

| | | | | |
|---|---|---|---|---|
| 4,131,908 A | * | 12/1978 | Daub | H01L 27/00 257/E27.032 |
| 4,987,465 A | * | 1/1991 | Longcor | H01L 27/0266 257/357 |
| 5,500,546 A | | 3/1996 | Marum et al. | |
| 5,530,612 A | * | 6/1996 | Maloney | H01L 27/0259 361/118 |
| 5,751,525 A | * | 5/1998 | Olney | H01L 27/0251 361/111 |
| 6,304,126 B1 | | 10/2001 | Berthiot | |
| 2019/0296545 A1 | * | 9/2019 | Rouviere | H02H 9/04 |
| 2020/0014200 A1 | * | 1/2020 | Peng | H01L 27/0251 |
| 2020/0373295 A1 | | 11/2020 | Tailliet | |

* cited by examiner

*Primary Examiner* — Kevin J Comber
(74) *Attorney, Agent, or Firm* — Slater Matsil, LLP

(57) ABSTRACT

The present description concerns an electrostatic discharge protection device including a first clipping circuit coupled between a first node and a second node and a second active clipping circuit, series-coupled with a first resistor, the second clipping circuit and the first resistor being coupled between the first and second nodes, the second clipping circuit including a field-effect transistor having a metal-oxide-semiconductor structure.

20 Claims, 3 Drawing Sheets

ELECTROSTATIC DISCHARGE PROTECTION DEVICE

CROSS-REFERENCE TO RELATED APPLICATIONS

This application claims the benefit of French Patent Application No. 2100868, filed on Jan. 29, 2021, which application is hereby incorporated herein by reference.

TECHNICAL FIELD

The present disclosure generally concerns electronic devices and, more specifically, electronic devices of protection against electrostatic discharges.

BACKGROUND

Different devices of prevention and of protection against electrostatic discharges, or ESD protection, are known.

SUMMARY

There is a need to improve the performance of current electrostatic discharge (ESD) protection devices.

An embodiment provides an electrostatic discharge protection device comprising a first clipping circuit coupled between a first node and a second node and a second active clipping circuit, series-coupled with a first resistor, the second clipping circuit and the first resistor being coupled between the first and second nodes, the second clipping circuit comprising a field-effect transistor having a metal-oxide-semiconductor structure.

According to an embodiment, the second circuit and the first resistor are coupled to each other by a third node, the third node being the output node of the device.

According to an embodiment, the field-effect transistor having a metal-oxide-semiconductor structure is an N-channel transistor.

According to an embodiment, the second clipping circuit has an on-state resistance smaller than 1 ohm.

According to an embodiment, the first resistor has a value smaller than 100 ohms.

According to an embodiment, the first clipping circuit comprises a bipolar transistor.

According to an embodiment, the bipolar transistor is an NPN-type transistor.

According to an embodiment, the first clipping circuit comprises a second resistor coupled between the control terminal of the bipolar transistor and the second node.

According to an embodiment, the second resistor has a value smaller than 1 ohm.

According to an embodiment, the clipping threshold of the first clipping circuit is higher than the clipping threshold of the second clipping circuit.

Another embodiment provides an electronic circuit comprising at least one device such as previously described.

According to an embodiment, at least two protection devices share a same circuit.

According to an embodiment, the third node is coupled to a terminal of the second clipping circuit by a diode.

According to an embodiment, the third output node of one of the devices is coupled to two second circuits, one being shared with at least another device.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
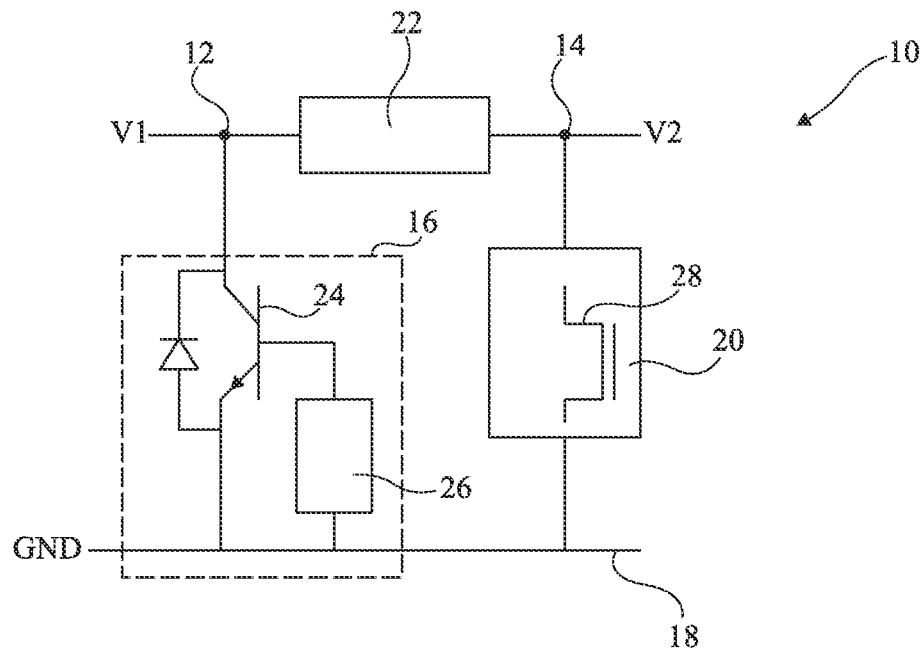
FIG. 1 shows an embodiment of an ESD protection device.

FIG. 1 shows an embodiment of an ESD protection device 10. Device 10 is located between two nodes 12 and 14 and a rail, or node 18 of application of a reference voltage, preferably ground GND. Device 10 protects a circuit, not shown, from electrostatic discharges. The performance of device 10 as to this protection is measured according to various standards, among which the so-called Human Body Model standard.

A voltage V1 is applied to node 12 and a voltage V2 is applied to node 14. Device 10 is located in an electronic circuit to protect components of the circuit coupled on the side of node 14 from discharges for example appearing on node 12 or components or connectors coupled on the side of node 12 from discharges for example appearing on node 14.

Device 10 comprises a first clipping circuit 16. Circuit 16 is coupled, preferably connected, between node 12 and node 18. In other words, a terminal of circuit 16 is coupled, preferably connected, to node 12 and another terminal of circuit 16 is coupled, preferably connected, to node 18.

Device 10 comprises a second clipping circuit 20 coupled, preferably connected, between node 14 and node 18. In other words, a terminal of circuit 20 is coupled, preferably connected, to node 14 and another terminal of circuit 20 is coupled, preferably connected, to node 18. Device 20 is an active device, that is, device 20 comprises at least one active component. Device 10 further comprises a resistor 22 coupled between nodes 12 and 14. In other words, a terminal of resistor 22 is coupled, preferably connected, to node 12 and another terminal of resistor 22 is coupled, preferably connected, to node 14.

Clipping circuit means a circuit intended to suppress overvoltages, that is, a circuit comprising two terminals and capable of being in an on state or in an off state. When the circuit is in the on state, a current can flow between the two terminals. When the circuit is in the off state, a current cannot flow between the two terminals. The state of the clipping circuit depends on the voltage between the two terminals. Thus, if the voltage between the two terminals is smaller than a clipping threshold, the circuit is in the off state. If the voltage between the two terminals is greater than a clipping threshold, the circuit is in the on state.

Preferably, one of the two terminals is coupled, preferably connected, to a node of application of a reference voltage, for example, the ground. In this case, the state of the clipping circuit depends on the voltage on the other terminal. Thus, if the voltage on the other terminal is smaller than a clipping threshold, the circuit is in the off state. If the voltage on the other terminal is greater than a clipping threshold, the circuit is in the on state. When the voltage on the other node reaches the threshold, for example, during an electrostatic discharge, the energy, and more precisely the current, may be discharged into ground.

Circuit 16 is a clipping circuit having a clipping threshold greater than the clipping threshold of circuit 20. For example, circuit 16 has a clipping threshold greater than twice the clipping threshold of circuit 20. For example, circuit 16 has a clipping threshold greater than 5 V, for example, substantially equal to 7.5. For example, circuit 20 has a threshold smaller than 5 V, for example, substantially equal to 2.5 V.

Further, circuit 16 is for example configured to withstand a current at least equal to 3 A. In other words, circuit 16 is for example configured so that a current of at least 3 A can cross it without damaging it. More generally, circuit 16 is for example configured to withstand an instantaneous discharge current of several amperes. According to the Human Body Model standard, this instantaneous current in amperes is in the order of Vzap/1,500, where Vzap is the discharge voltage, in volts.

Circuit 16 comprises, for example, a transistor 24. Transistor 24 is preferably a bipolar transistor, for example, an NPN-type transistor. Transistor 24 is coupled, preferably connected, between nodes 12 and 18. Preferably, a conduction terminal of transistor 24, preferably the collector of transistor 24, is coupled, preferably connected, to node 12 and another conduction terminal of transistor 24, preferably the emitter of transistor 24, is coupled, preferably connected, to node 18. Circuit 16 for example comprises a resistor 26 coupled between the control terminal of transistor 24, for example, the base, and node 18. In other words, a terminal of resistor 26 is coupled, preferably connected, to the base of transistor 24 and another terminal of resistor 26 is coupled, preferably connected, to node 18. Preferably, circuit 16 comprises a diode, having its cathode coupled, preferably connected, to node 12 and having its anode coupled, preferably connected, to node 18. The diode is for example an intrinsic diode of transistor 24.

Circuit 20 comprises a metal-oxide-semiconductor field-effect transistor 28, or MOSFET transistor. Circuit 20 for example only comprises transistor 28. Transistor 28 is preferably an N-channel MOSFET transistor. The transistor is coupled, preferably connected, between node 14 and node 18. In other words, a conduction terminal of transistor 28, for example, the drain, is coupled, preferably connected, to node 14 and another conduction terminal of transistor 28, for example, the source, is coupled, preferably connected, to node 18. Transistor 28 is a controlled transistor, that is, a transistor having a potential on the gate controlled by a circuit, not shown, for example, a circuit external to circuit 10, so that in case of a detection of a positive overvoltage between node 12 and node 18, the gate potential increases to set transistor 28 to the on state. In other words, the gate of transistor 28 is not controlled by a fixed or constant potential during the operation of device 10. The gate of transistor 28 is not coupled to a node having a fixed or constant potential delivered thereon during the operation of device 10.

During a positive discharge, for example, on node 12, most of the energy of the discharge transits through circuit 16, which conducts the current between node 12 and node 18, for example, the ground. For example, in the case where transistor 24 is an NPN transistor, it operates in collector-emitter breakdown mode. The potential at the level of circuit 16, that is, on node 12, however remains too high, since the clipping threshold cannot be decreased without increasing the surface area of the circuit in a problematical way. Circuit 20 decreases this potential to a value which does not risk damaging the device coupled to node 14. The energy transiting through circuit 20 is much lower than the energy transiting through circuit 16.

During a negative discharge, the discharge crosses circuit 16, more particularly the diode of circuit 16.

Figure 2:
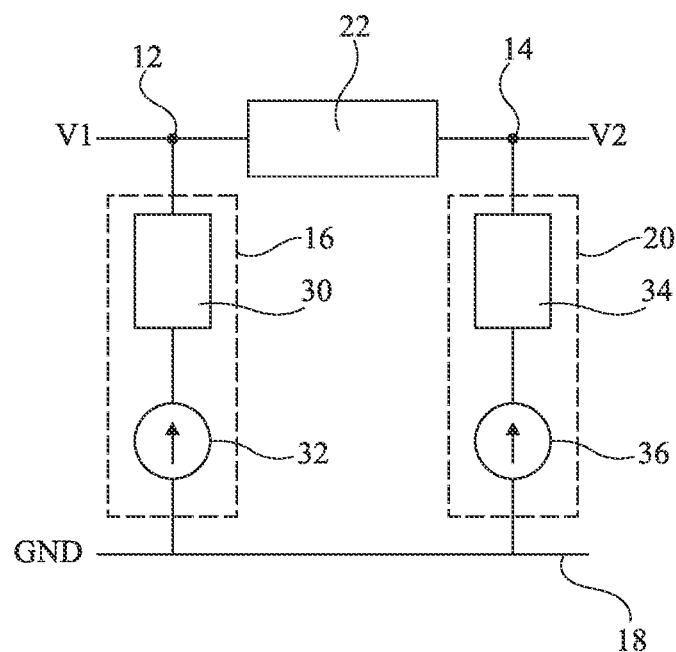
FIG. 2 shows an equivalent circuit of the embodiment of FIG. 1.

FIG. 2 shows an equivalent circuit of the embodiment of FIG. 1 during a discharge. In particular, FIG. 2 shows a circuit equivalent to the device 10 of FIG. 1 when a current peak appears on the side of node 12, that is, when the clipping circuits are in an on state.

The equivalent circuit comprises elements identical to the elements of the device 10 of FIG. 1, which will not be detailed again.

The equivalent circuit differs from the device of FIG. 1 in that each clipping circuit 16, 20 is replaced with an equivalent circuit, that is, a circuit having identical characteristics, preferably behaving identically. More precisely, each clipper is replaced with a resistor and a voltage source in series, the resistor corresponding to the on-state resistance and the value of the voltage source corresponding to the threshold of the clipping circuit.

Circuit 16 thus comprises, in the equivalent representation, a resistor 30 in series with a voltage source 32 between nodes 12 and 18. In other words, circuit 16 behaves as a circuit comprising source 32 coupled, preferably connected, by a first terminal to node 18 and by a second terminal to a first terminal of resistor 30, the second terminal of resistor 30 being coupled, preferably connected, to node 12. Circuit 16 is for example selected to have an on-state resistance smaller than 5 ohms, preferably smaller than 1 ohm, for example, smaller than 500 milliohms, for example, substantially equal to 100 milliohms. Circuit 16 is for example selected to have a clipping threshold, corresponding to the voltage value delivered by voltage source 32 in the equivalent circuit, greater than 5 V, for example, substantially equal to 7.5 V.

Similarly, circuit 20 thus comprises, in the equivalent representation, a resistor 34 in series with a voltage source 36 between nodes 14 and 18. In other words, circuit 20 behaves as a circuit comprising source 36 coupled, preferably connected, by a first terminal to node 18 and by a second terminal to a first terminal of resistor 34, the second terminal of resistor 34 being coupled, preferably connected, to node 14. Circuit 20 is for example selected to have an on-state resistance smaller than 5 ohms, preferably smaller than 1 ohm, for example, substantially equal to 1 ohm. Circuit 20 is for example selected to have a clipping threshold, corresponding to the voltage value delivered by voltage source 36 in the equivalent circuit, greater than 5 V, for example, substantially equal to 2.5 V.

When a current peak occurs, for example, on node 12, circuit 16 enters an on state and part of the energy is discharged into ground via circuit 16. Similarly, circuit 20 enters the on state. The device then operates like the equivalent circuit of FIG. 2.

Resistors 22 and 34 form a voltage divider enabling to obtain a voltage on node 14 smaller than the voltage on node 12. Thus, clipping circuit 20 does not need to be configured to withstand voltages and currents as high as in circuit 16.

The clipping voltage of device 10 is dependent on the intrinsic thresholds of clipping circuits 16 and 20 and on the values of the resistors of device 10. The clipping voltage of device 10 is smaller than the threshold of circuit 16, that is, the threshold of the clipping circuit located on the side of node 12. The clipping voltage of device 10 is greater than the threshold of circuit 20, that is, the threshold of the clipping circuit located on the side of node 14.

The clipping voltage of device 10 during a discharge is determined by the following equation:

$$VOUTS = S2 + \frac{(V1 - S2) * R2}{R2 * R3} \quad \text{[Math 1]}$$

where VOUTS is the value of the clipping threshold of device 10, S2 is the threshold value of device 20, that is, the value of voltage source 36 (FIG. 2), R2 is the on-state resistance of device 20, that is, the value of resistor 34 (FIG. 2), and R3 is the value of resistor 22.

Resistor 22 preferably has a relatively low value to avoid causing too high an energy loss in normal operating mode, that is, when the clipping circuits are in an off state, in other words, when the circuits internal to the product, coupled, to node 14, bypass a significant current (typically towards the ground potential) during the normal operation of the product. A significant voltage drop would disturb the operation of the circuit. Preferably, resistor 22 has a value smaller than 100 ohms, preferably in the range from 10 ohms to 30 ohms, preferably substantially equal to 20 ohms.

As a variant, transistor 24 and resistor 26 may be replaced with another clipping circuit capable of withstanding a current greater than 3 A and having an on-state resistance smaller than 5 ohms, preferably smaller than 1 ohm, for example, smaller than 500 microohms, for example, substantially equal to 100 microohms, and a clipping threshold greater than the threshold of circuit 20, for example, greater than 5 V, for example, substantially equal to 7.5 V.

It could have been chosen to only use a clipping circuit such as circuit 16. However, such clipping circuits do not enable to obtain sufficiently low clipping thresholds. The clipping threshold of such a circuit is greater than 5 V, generally greater than 7 V. Such a circuit is not adapted to the protection of components capable of being damaged by a voltage in the order of 3 V or smaller than 3 V.

It could have been chosen to only use a clipping circuit such as circuit 20. However, the energy that can be discharged into ground by such a circuit depends on the size of transistor 28. To be able to withstand such a high current peak while having a relatively low clipping threshold, that is, for example, lower than 5 V, the dimensions of transistor 28 should then be significant, with for example a channel width greater than 1,000 μm, for example, greater than 10,000 μm, which causes a strong loss of surface area. Further, such transistors comprise significant leakages, which adversely affects the performance of the product, in particular by increasing its idle power consumption.

An advantage of the previously-described embodiments is that they enable to form an ESD protection device capable of withstanding a significant current peak while having a low clipping threshold. Further, the surface area of the ESD protection device is advantageously small, in particular as compared with a device only comprising a transistor 28, since the transistor 28 of the embodiment of FIG. 1 only has to withstand a small portion of the current generated during a current peak.

Another advantage of the described embodiment is that the leakage currents of the device are low as compared with a usual protection device, in particular as compared with a device only comprising a clipping circuit such as circuit 20.

Figure 3:
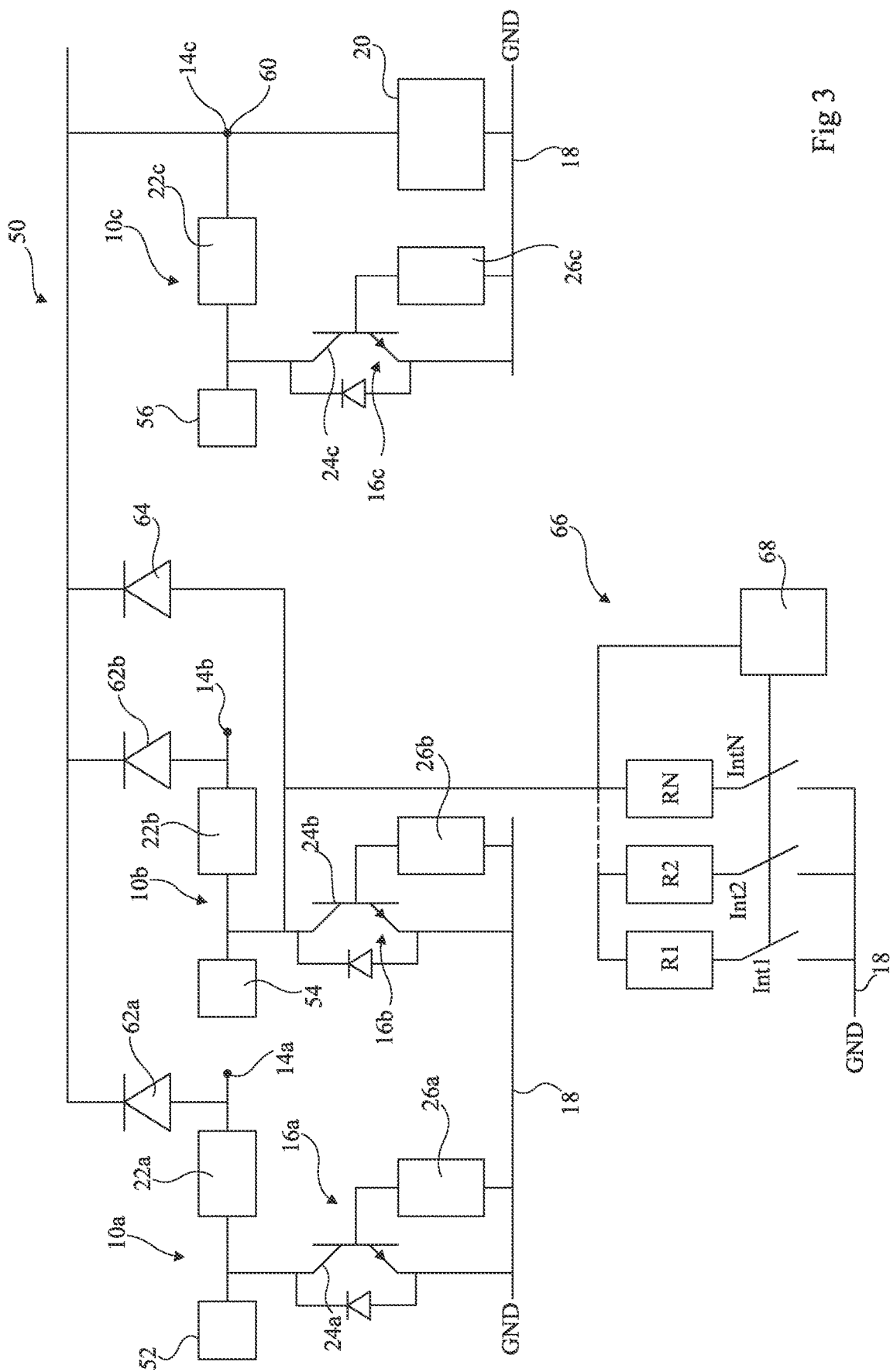
FIG. 3 shows an example of application of the embodiment of FIG. 1.

FIG. 3 shows an example of application of the embodiment of FIG. 1. FIG. 3 shows an electronic circuit 50.

Circuit 50 comprises three terminals 52, 54, 56, each represented by a block. Terminal 52 for example corresponds to a clock input, that is, receiving a clock signal, or an input receiving a write control signal. Terminal 54 corresponds to an input/output receiving and transmitting data, for example, binary data. Terminal 56 is for example a power supply terminal, that is, an input receiving the power supply voltage of circuit 50. More generally, circuit 50 may have any number of terminals.

Circuit 50 preferably comprises an ESD protection device having an operation similar to that of the device of FIG. 1 for each terminal. Thus, in the example of FIG. 3, device 50 comprises three devices 10*a*, 10*b*, and 10*c*. Terminal 52 is coupled, preferably connected, to device 10*a*, terminal 54 is coupled, preferably connected, to device 10*b*, and terminal 56 is coupled, preferably connected, to device 10*c*. Preferably, at least certain devices 10 share a same circuit 20. In the example of FIG. 3, circuits 10 all share the same circuit 20.

More precisely, device 10*a* comprises a circuit 16*a*, a resistor 22*a*, and circuit 20. Circuit 16*a* is coupled, preferably connected, between terminal 52 and node 18. Circuit 16*a* comprises a transistor 24*a* and a resistor 26*a*. Transistor 24*a* is, like the transistor 24 of FIG. 1, preferably a bipolar transistor, for example, an NPN-type transistor. Transistor 24*a* is coupled, preferably connected, between terminal 52 and node 18. Preferably, a conduction terminal of transistor 24*a*, preferable a collector terminal of transistor 24*a*, is coupled, preferably connected, to terminal 52 and another conduction terminal of transistor 24*a*, preferably the emitter terminal of transistor 24*a*, is coupled, preferably connected, to node 18. Resistor 26*a* is preferably coupled between the control terminal of transistor 24*a*, for example, the base, and node 18. In other words, a terminal of resistor 26*a* is coupled, preferably connected, to the base of transistor 24*a* and another terminal of resistor 26*a* is coupled, preferably connected, to node 18.

The resistor 22*a* of circuit 10*a* is coupled, preferably connected, between terminal 52 and an output node 14*a* of device 10*a*. In other words, a terminal of resistor 22*a* is coupled, preferably connected, to terminal 52 and another terminal of resistor 22*a* is coupled, preferably connected, to node 14*a*.

Node 14*a* is for example coupled to other elements of circuit 50, being protected by circuits 10. Node 14*a* is further coupled to a terminal of circuit 20 common to devices 10. Node 14*a* is preferably coupled to a terminal of circuit 20 by a diode 62a. The cathode of diode 62a is coupled, preferably connected, to a node 60 corresponding to a terminal of circuit 20. The anode of diode 62a is coupled, preferably connected, to node 14a.

Similarly, device 10b comprises a resistor 22b, a transistor 24b, a resistor 26b, circuit 20, and a diode 62b coupled in the same way. Thus, resistor 22b is coupled between terminal 54 and an output node 14b of device 10b. Transistor 24b is coupled by its conduction terminals between terminal 54 and node 18. Resistor 26b is coupled between the control terminal, that is, the base, of transistor 24b and node 18. Node 14b is coupled to node 60 by diode 62b. An anode of diode 62b is coupled, preferably connected, to node 14b and the cathode of diode 62b is coupled, preferably connected, to a terminal of circuit 20.

Terminal 54 is for example coupled, preferably connected, to node 60 by a diode 64. The anode of diode 64 is coupled, preferably connected, to terminal 54 and the cathode of diode 64 is coupled, preferably connected, to node 60. Diode 64 is thus coupled in parallel with diode 62b and resistor 22b. Diode 64 enables to protect terminal 54 from an overvoltage.

The terminal, that is, terminal 54 in the example of FIG. 3, may for example be coupled to node 18 by a resistive assembly 66, having a total resistance that may vary. Assembly 66 for example comprises a plurality of series associations of a resistor R1, R2, RN and of a switch Int1, Int2, IntN, for example, a transistor, for example, an N-channel MOS transistor. In each association, a terminal of the resistor is for example coupled, preferably connected, to terminal 54, another terminal of the resistor is coupled, preferably connected, to a terminal of the switch, and another terminal of the switch is coupled, preferably connected, to node 18. The switches are controlled by a circuit 68. Circuit 68 is coupled, preferably connected, to the control terminals of switches Int1, Int2, IntN. Circuit 68 supplies the switch control signals.

Similarly, device 10c comprises a resistor 22C, a transistor 24c, a resistor 26c, and circuit 20 coupled in the same way. Thus, the resistor is coupled between terminal 56 and an output node 14c of device 10c. Transistor 24c is coupled by its conduction terminals between terminal 56 and node 18. Resistor 26c is coupled between the control terminal, that is, the base, of transistor 24c and node 18. Node 14c is coupled, preferably connected, to node 60. Preferably, node 14c, that is, the output node of device 10c coupled to the power supply terminal, is not coupled to node 60 by a diode.

The presence of diodes 62 advantageously enables devices 10 to have a common circuit 20. Indeed, the presence of a current peak on one of the terminals modifies the voltage on node 14c, but does not impact the other nodes 14. In other words, diodes 62a, 62b enable to have circuit 20, shown in FIG. 3 as a portion of device 10c, shared by devices 10a or 10b (inputs or inputs-outputs). Thus, device 10a forms a device such as the device of FIG. 1, where the circuit 20 of FIG. 1 is replaced with diode 62a and the circuit 20 of FIG. 3. Similarly, in the case of device 10b, the circuit 20 of FIG. 1 is replaced with diode 62b and the circuit 20 of FIG. 3. Diodes 62a and 62b also enable to avoid electric conflicts between devices 10a, 10b, and 10c in normal operation, the maximum voltage at the input of devices 10a, 10b, and 10c in normal operation of the circuit being smaller than or equal to the power supply voltage of the load coupled to node 60.

For example, at least some of devices 10, for example, all the devices 10 are identical, that is, resistors 22a, 22b, 22c, transistors 24a, 24b, 24c, and resistors 26a, 26b, 26c are identical to one another. Similarly, diodes 62a, 62b are for example identical to each other. As a variant, at least certain devices 10 may have different characteristics.

Figure 4:
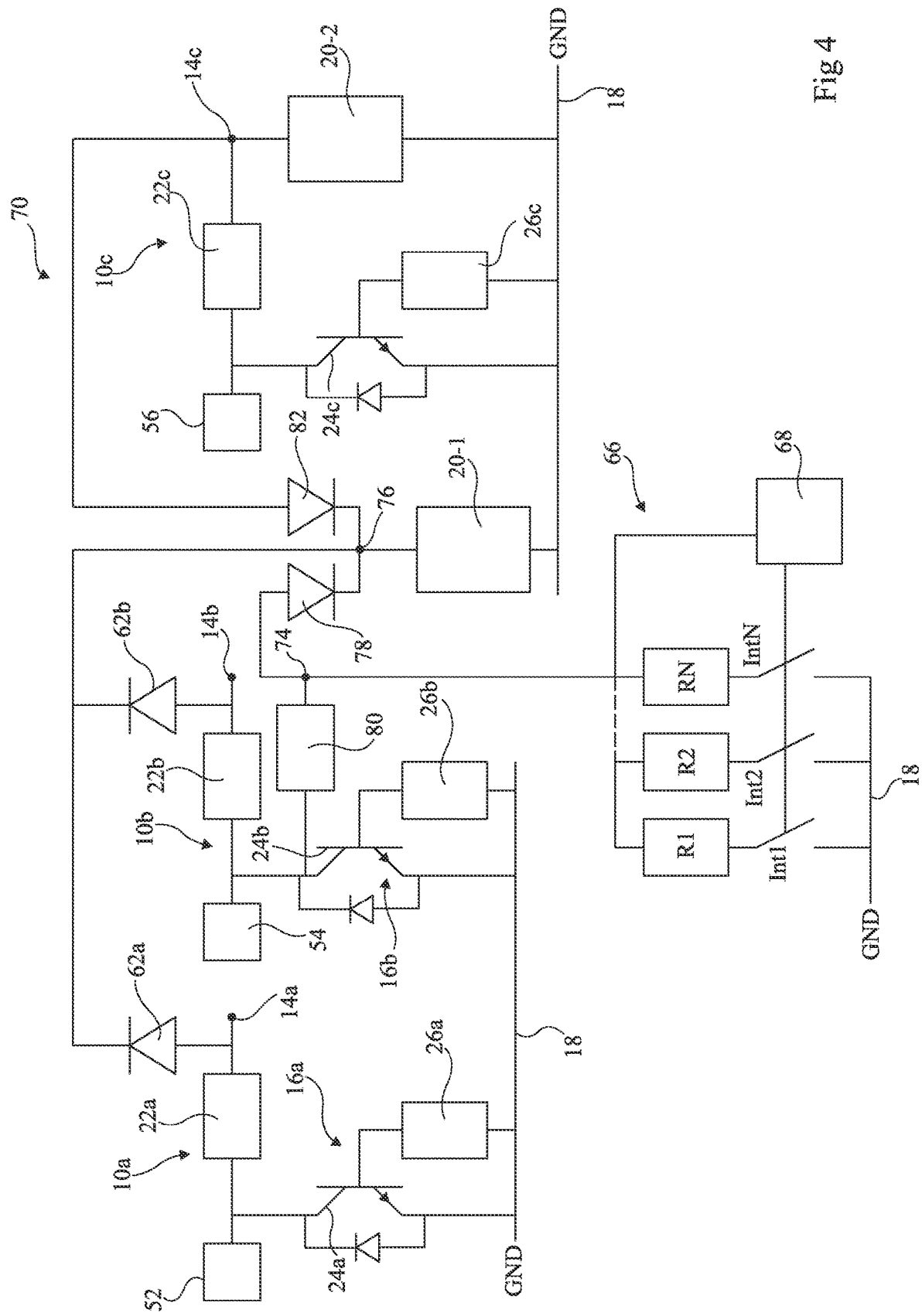
FIG. 4 shows another example of application of the embodiment of FIG. 1.

FIG. 4 shows another example of application of the embodiment of FIG. 1. FIG. 4 shows an electronic circuit 70.

Circuit 70 comprises elements identical to circuit 50. In particular, circuit 70 comprises terminals 52, 54, 56. Further, circuit 70 comprises devices 10a, 10b, 10c.

Device 70 differs from device 50, among others, in that devices 10a, 10b on the one hand, and device 10c on the other hand, comprise distinct circuits 20.

More precisely, device 10a is coupled, preferably connected, to terminal 52. Device boa comprises, as previously described, a circuit 16a, a resistor 22a, and a diode 62a. Circuit 16a is coupled, preferably connected, between terminal 52 and node 18. Circuit 16a comprises transistor 24a and resistor 26a. Transistor 24a is preferably a bipolar transistor, for example, an NPN-type transistor. Transistor 24a is coupled, preferably connected, between terminal 52 and node 18. Preferably, a conduction terminal of transistor 24a, preferably the collector of transistor 24a, is coupled, preferably connected, to terminal 52 and another conduction terminal of transistor 24a, preferably the emitter of transistor 24a, is coupled, preferably connected, to node 18. Resistor 26a is preferably coupled between the control terminal of transistor 24a, for example, the base, and node 18. In other words, a terminal of resistor 26a is coupled, preferably connected, to the base of transistor 24a and another terminal of resistor 26a is coupled, preferably connected, to node 18.

The resistor 22a of circuit 10a is coupled, preferably connected, between terminal 52 and the output node 14a of device 10a. In other words, a terminal of resistor 22a is coupled, preferably connected, to terminal 52 and another terminal of resistor 22a is coupled, preferably connected, to node 14a.

Node 14a is for example coupled to other elements of circuit 70, being protected by circuits 10. Node 14a is further coupled to a terminal of a circuit 20-1 common to devices 10a and 10b. Node 14a is preferably coupled to a terminal of circuit 20-1 by diode 62a. The cathode of diode 62a is coupled, preferably connected, to a node 76. The anode of diode 62a is coupled, preferably connected, to node 14a. The other terminal of circuit 20-1 is coupled, preferably connected, to node 18.

Device 10b comprises transistor 24b, resistors 26b, 22b, and diode 62b coupled similarly to the elements of device 10a. The cathode of diode 62b is thus coupled, preferably connected, to node 76.

Terminal 54 is coupled to the previously-described resistive element 66, for example, by a resistor 80. More precisely, a terminal of resistor 80 is coupled, preferably connected, to terminal 54 and another terminal of resistor 80 is coupled, preferably connected, to a node 74. Node 74 is preferably coupled to node 76, corresponding to a terminal of circuit 20-1, by a diode 78. The cathode of diode 78 is coupled, preferably connected, to node 76 and the anode of diode 78 is coupled, preferably connected, to node 74.

Terminal 56 is coupled to device 10c. Device 10c comprises transistor 24c and resistors 22c and 26c coupled together respectively like transistor 24a and resistors 22a and 26a. The output node 14c of device 10c is coupled to node 76 by a diode 82. More precisely, the cathode of diode 82 is coupled, preferably connected, to node 76 and the anode of diode 82 is coupled, preferably connected, to node 14c. Further, node 14c is coupled, preferably connected, to a terminal of a circuit 20-2, the other terminal of circuit 20-2 being coupled, preferably connected, to node 18.

Device 10c, that is, the ESD protection device coupled to one of its terminals, preferably the power supply terminal, comprises two circuits such as the circuit 20 of FIG. 1. Preferably, the clipping threshold of circuit 20-2 is lower than the threshold of circuit 20-1.

The embodiment of FIG. 4 enables device 70 to withstand voltages at the level of terminals 52, 54 of devices 10a and 10b higher than the power supply voltage. Diode 82 enables to avoid a current return from node 76 to the power supply voltage, that is, to node 14c. This is advantageous in the case of circuits operating over an inter-integrated circuit (I2C) serial bus, where it is possible for the voltages at the level of lines serial data (SDA), for example, terminal 54, and/or serial clock (SCL), for example, terminal 52, to be greater than the power supply voltage of the circuit. Diode 82 charges the voltage of node 76 to the value of the potential of terminal 56, that is, the terminal having the power supply voltage supplied thereon, minus the threshold of voltage 82 (typically 600 mV), while avoiding a return of current 76 towards the power supply voltage. The charge of node 76 increases the input impedance of terminals 52 and 54, by masking leakage currents, and the stray capacitance of circuit 20-1.

An advantage of the embodiments of FIGS. 3 and 4 is that they enable to decrease the number of circuits 20, which are surface intensive.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

What is claimed is:

1. An electronic circuit comprising:
   a plurality of first clipping circuits, each comprising:
      a bipolar transistor, having a first conduction path coupled between a first node and a common second node; and
      a second resistor coupled between a control terminal of the bipolar transistor and the common second node, wherein the second resistor is separate from the bipolar transistor;
   a plurality of first resistors, each coupled between a respective one of the first nodes and a respective third node;
   a second clipping circuit, shared by each of the first clipping circuits, and comprising a metal-oxide-semiconductor field-effect transistor having a second conduction path coupled between each third node and the common second node; and
   a plurality of protected devices, each coupled to a respective one of the third nodes;
   wherein at least one of the third nodes is coupled to a terminal of the second clipping circuit by a respective diode; and
   wherein another one of the third nodes is connected to the terminal of the second clipping circuit without an intervening diode.

2. The electronic circuit according to claim 1, wherein each third node is an output node of the respective first resistor and associated first clipping circuit.

3. The electronic circuit according to claim 2, wherein at least two of the output nodes are coupled to the terminal of the second clipping circuit by a respective diode.

4. The electronic circuit according to claim 1, wherein the metal-oxide-semiconductor field-effect transistor is an N-channel transistor.

5. The electronic circuit according to claim 1, wherein the second clipping circuit has an on-state resistance smaller than 1 ohm.

6. The electronic circuit according to claim 1, wherein the first resistor has a value smaller than 100 ohms.

7. The electronic circuit according to claim 1, wherein a respective first clipping threshold of each first clipping circuit is greater than a second clipping threshold of the second clipping circuit.

8. The electronic circuit according to claim 1, wherein the bipolar transistor is an NPN-type transistor.

9. The electronic circuit according to claim 1, wherein the second resistor has a value smaller than 1 ohm.

10. The electronic circuit according to claim 1, further comprising:
    a resistive assembly coupled between one of the first nodes and the common second node; and
    an additional diode coupled between the resistive assembly and the terminal of the second clipping circuit.

11. The electronic circuit according to claim 1, wherein a first one of the first nodes is a clock input terminal, a second one of the first nodes is an input/output terminal, and a third one of the first nodes, that is associated with the third node connected to the terminal of the second clipping circuit without the intervening diode, is a power supply terminal.

12. An electronic circuit comprising:
    a plurality of first clipping circuits, each comprising:
       a bipolar transistor, having a first conduction path coupled between a first node and a common second node; and
       a second resistor coupled between a control terminal of the bipolar transistor and the common second node, wherein the second resistor is separate from the bipolar transistor;
    a plurality of first resistors, each coupled between a respective one of the first nodes and a respective third node;
    a second clipping circuit, shared by each of the first clipping circuits, and comprising a metal-oxide-semiconductor field-effect transistor having a second conduction path coupled between each third node and the common second node;
    a plurality of protected devices, each coupled to a respective one of the third nodes, wherein each of the third nodes is coupled to the second clipping circuit by a respective diode;
    a third clipping circuit, comprising:
       a second bipolar transistor, having a third conduction path coupled between a fourth node and the common second node; and
       a third resistor coupled between a control terminal of the second bipolar transistor and the common second node, wherein the third resistor is separate from the second bipolar transistor;
    a fourth clipping circuit, comprising a metal-oxide-semiconductor field-effect transistor having a fourth conduction path connected between a fifth node and the common second node; and
    a fourth resistor, connected between the fourth node, and the fifth node without an intervening diode, wherein the fifth node is coupled to the second clipping circuit by another diode.

13. The electronic circuit according to claim 12, wherein each third node is an output node of the respective first resistor and associated first clipping circuit.

14. The electronic circuit according to claim 12, wherein the metal-oxide-semiconductor field-effect transistors are N-channel transistors.

15. The electronic circuit according to claim 12, wherein the bipolar transistors are NPN-type transistors.

16. The electronic circuit according to claim 12, wherein the second clipping circuit has an on-state resistance smaller than 1 ohm.

17. The electronic circuit according to claim 12, wherein the first resistor has a value smaller than 100 ohms, and the second resistor has a value smaller than 1 ohm.

18. The electronic circuit according to claim 12, wherein a respective first clipping threshold of each first clipping circuit is greater than a second clipping threshold of the second clipping circuit.

19. The electronic circuit according to claim 12, further comprising:
   a resistive assembly coupled between one of the first nodes and the common second node; and
   an additional diode coupled between the resistive assembly and the second clipping circuit.

20. The electronic circuit according to claim 12, wherein a first one of the first nodes is a clock input terminal, a second one of the first nodes is an input/output terminal, and the fourth node is a power supply terminal.

\* \* \* \* \*